United States Patent
Wang (10) Patent No.: US 8,193,094 B2
(45) Date of Patent: Jun. 5, 2012

(54) POST CMP PLANARIZATION BY CLUSTER ION BEAM ETCH

(75) Inventor: Shiang-Bau Wang, Pingzchen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 123 days.

(21) Appl. No.: 12/819,743

(22) Filed: Jun. 21, 2010

(65) Prior Publication Data

US 2011/0312180 A1   Dec. 22, 2011

(51) Int. Cl.
*H01L 21/302* (2006.01)
*H01L 21/461* (2006.01)
(52) U.S. Cl. ............. 438/692; 216/66; 216/89; 438/704
(58) Field of Classification Search .................. 438/692, 438/704; 216/66, 89
See application file for complete search history.

(56) References Cited

U.S. PATENT DOCUMENTS

| 2005/0042800 | A1* | 2/2005 | Yamada et al. | 438/105 |
| 2007/0117342 | A1* | 5/2007 | Chen et al. | 438/401 |
| 2009/0087578 | A1  | 4/2009 | Hautala | |

* cited by examiner

*Primary Examiner* — Roberts Culbert
(74) *Attorney, Agent, or Firm* — Lowe Hauptman Ham & Berner, LLP (57) ABSTRACT

The embodiments of mechanisms described enables improved planarity of substrates, which is crucial for patterning and device yield improvement. Chemical-mechanical polishing (CMP) is used to remove film to planarize the substrate before the final thickness is reached or before all removal film is polished. The substrate is then measured for its topography and film thickness. The topography and thickness data are used by the gas cluster ion beam (GCIB) etch tool to determine how much film to remove on a particular location. GCIB etch enables removal of final layer to meet the requirements of substrate uniformity and thickness target. The mechanisms enable improved planarity to meet the requirement of advanced processing technologies.

20 Claims, 9 Drawing Sheets

POST CMP PLANARIZATION BY CLUSTER ION BEAM ETCH

FIELD

This application relates to planarization and, more particularly, to performing substrate planarization by cluster ion beam (CIB) etch after chemical-mechanical polishing (CMP).

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also required that the various processes utilized to fabricate the IC features with minimal dimensional and geometrical variations. For advanced processing technologies, substrate planarity enables patterning of fine features. Conventional processing techniques could leave regions with varying step heights and undesirable film(s) on the substrate. These varying step heights and un-desirable residual film(s) contribute to poor patterning and reduced yield. It is within this context, the following disclosure arises.

BRIEF DESCRIPTION OF THE DRAWINGS

The present disclosure will be readily understood by the following detailed description in conjunction with the accompanying drawings, wherein reference numerals designate like structural elements.

DETAILED DESCRIPTION OF THE EXEMPLARY EMBODIMENTS

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Chemical-mechanical polishing (CMP) is a process that is used to remove films from substrate surface. It is often used to remove film on a substrate surface with topography. Since the polishing pad of CMP presses on the entire substrate surface, the process can remove surface topography across the entire substrate (or globally). CMP can be used to remove various types of films, such as polysilicon, oxide, metals, etc. However, in some applications, CMP can introduce within wafer (WIW) and within die (WID) non-uniformity, which can impact lithographical patterning in forming fine features.

Figure 1A:
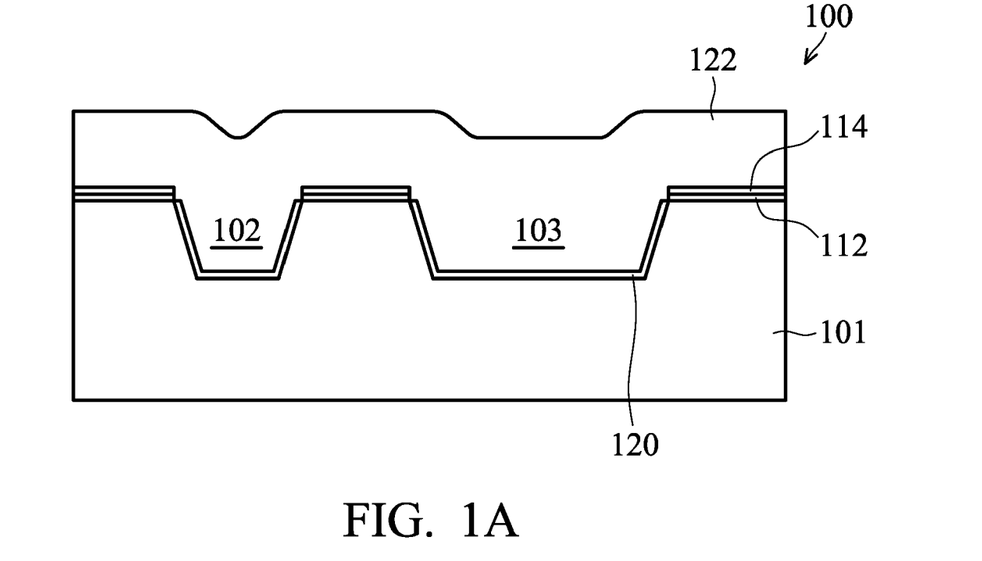
FIG. 1A shows a device region on a substrate, in accordance with some embodiments.

FIG. 1A shows a semiconductor device region 100 on a substrate 101, in accordance with some embodiments. In some embodiments, the substrate 101 is a semiconductor substrate (or semiconductor wafer). The semiconductor substrate 101 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In some embodiments, the alloy semiconductor substrate may have a gradient SiGe feature in which the Si and Ge composition change from one ratio at one location to another ratio at another location of the gradient SiGe feature. In some other embodiments, the alloy SiGe is formed over a silicon substrate. In some other embodiments, a SiGe substrate is strained. Furthermore, in some embodiments, the semiconductor substrate may be a semiconductor on insulator (SOI) or a thin film transistor (TFT). In some examples, the semiconductor substrate may include a doped epi layer or a buried layer. In some other examples, the compound semiconductor substrate may have a multilayer structure, or the silicon substrate may include a multilayer compound semiconductor structure. The substrate 101 may alternatively be a non-semiconductor material such as a glass substrate.

On substrate 101, there are shallow trenches 102 and 103, which are formed by etching and patterning a first dielectric layer 112 and a second dielectric layer 114. Layer 112 and layer 114 may be formed by a deposition process, such as chemical vapor deposition (CVD), including plasma-enhanced CVD (PECVD), thermal CVD, high-density-plasma CVD (HDPCVD), etc., or a spin-on process. Other applicable processes may also be used. In one example, forming the first dielectric layer 112 may comprise growing a pad oxide over the semiconductor substrate 101. Further, the layers 112, 114 may comprise any suitable composition and/or thickness. The second dielectric layer 114 may comprise a nitrogen-containing material, such as silicon nitride and/or silicon oxynitride; an amorphous carbon material; silicon carbide; other suitable materials; and/or combinations thereof. In the present embodiment, the second dielectric layer 114 comprises a silicon nitride layer. It is understood that the layers 112, 114 may each include a single layer or multiple layers. It is further understood that, in some embodiments, the first dielectric layer 112 or second dielectric layer 114 may be omitted entirely from semiconductor device region 100.

After trenches 102 and 103 are formed, the openings are lined with a liner layer 120 and a filler layer 122, in accordance with some embodiments. The liner layer 120 may be formed over trenches 102 and 103 by any suitable process. For example, forming the liner layer 120 may comprise growing a thermal oxide trench liner to improve the trench interface. In some embodiments, the liner layer 120 is omitted entirely from semiconductor device region 100. The filler layer 122 deposited over the semiconductor substrate 101 fills the trenches. In some embodiments, the filler layer 122 comprises a dielectric material, such as silicon oxide, silicon nitride, silicon oxynitride, fluoride-doped silicate glass (FSG), a low-K dielectric material, other suitable materials, and/or combinations thereof. Further, the filler layer 122 may be formed by any suitable deposition process, such as CVD, PVD, ALD, sputtering, plating, high-density plasma (HDP) processes, high aspect ratio deposition processes (HARP), other suitable methods, and/or combinations thereof. In some embodiments, the trenches are filled with a CVD oxide.

Figure 1B:
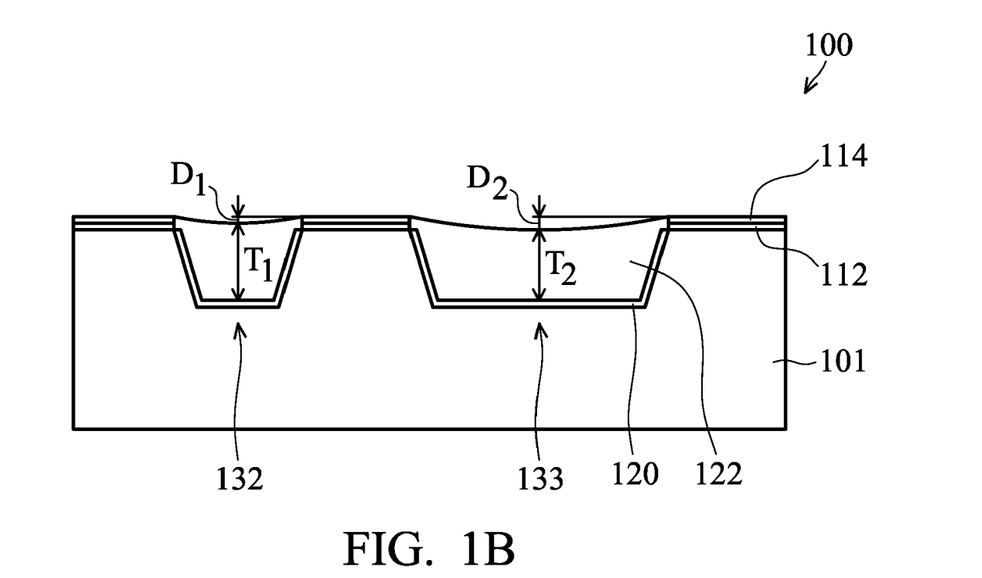
FIG. 1B shows the device region of FIG. 1A after a chemical-mechanical polishing (CMP) process is performed, in accordance with some embodiments.
Figure 1C:
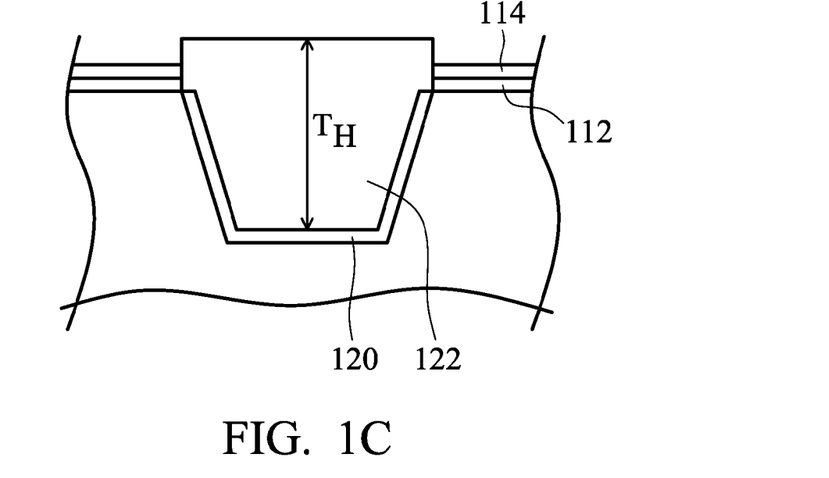
FIG. 1C shows a filler layer of a trench that is under-polished, in accordance with some embodiments.
Figure 1D:
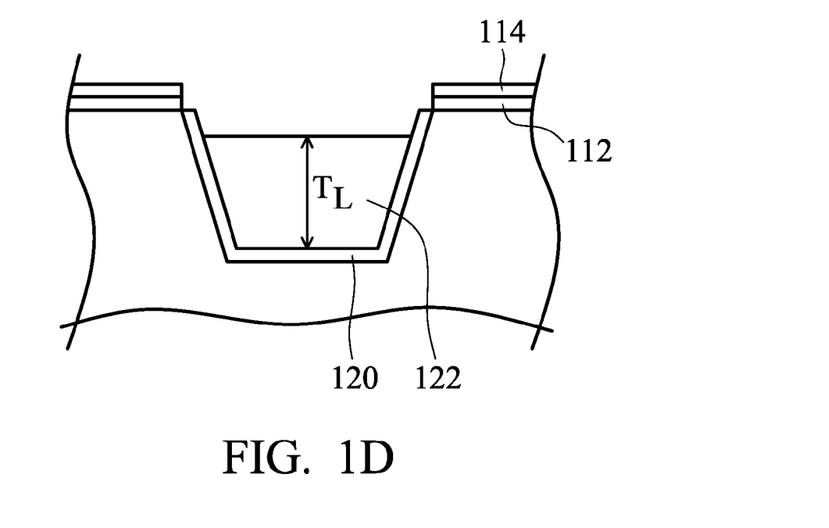
FIG. 1D shows a filler layer of a trench that is over-polished, in accordance with some embodiments.

Thereafter, referring to FIG. 1B, a chemical mechanical polishing (CMP) process is performed on the filler layer 122 to etch back and planarize the filler layer 122 until the second layer 114 (i.e., in the present embodiment, the silicon nitride layer) is reached and exposed. The CMP process may selectively stop at the second dielectric layer 114, completing the formation of the shallow trench isolations (STIs) 132 and 133, which comprise the liner layer 120 and filler layer 122, leaving the STIs with step heights or thicknesses, $T_1$ and $T_2$, as illustrated in FIG. 1B. Due to CMP process variation, thicknesses of filler layer 122 in the trenches, such as $T_1$ and $T_2$, can be different across the substrate (WIW variation) and across a die (WID variation). FIG. 1C shows that CMP can leave the filler layer 122 protruding above the second dielectric layer 124, which results in a thickness $T_H$ relatively larger than the target thickness (such as the thickness when CMP stops at second dielectric layer), on some parts of the substrate (or wafer) in some embodiments. In contrast, in some other embodiments, FIG. 1D shows that CMP can leave the filler layer 122 recessed above the second dielectric layer 124, which results in a thickness $T_L$ relatively smaller than the target thickness, on some parts of the substrate.

Dishing effect of CMP can also change the height of the filler layer 122 in the trenches. In FIG. 1B, STI structure 133 is much wider than STI structure 132. The dishing effect of CMP causes the filler layer 122 to dip below the surface at distance $D_2$ for STI 133 that is larger than distance $D_1$ for STI 132. The different thickness of filler layer 122, as shown in FIGS. 1B, 1C, and 1D, and different dishing amount in different trenches, as shown in FIG. 1B, across the substrate create different step heights on the substrate, which could degrade lithographical quality of patterns, such as patterning of gate structures.

Figure 1E:
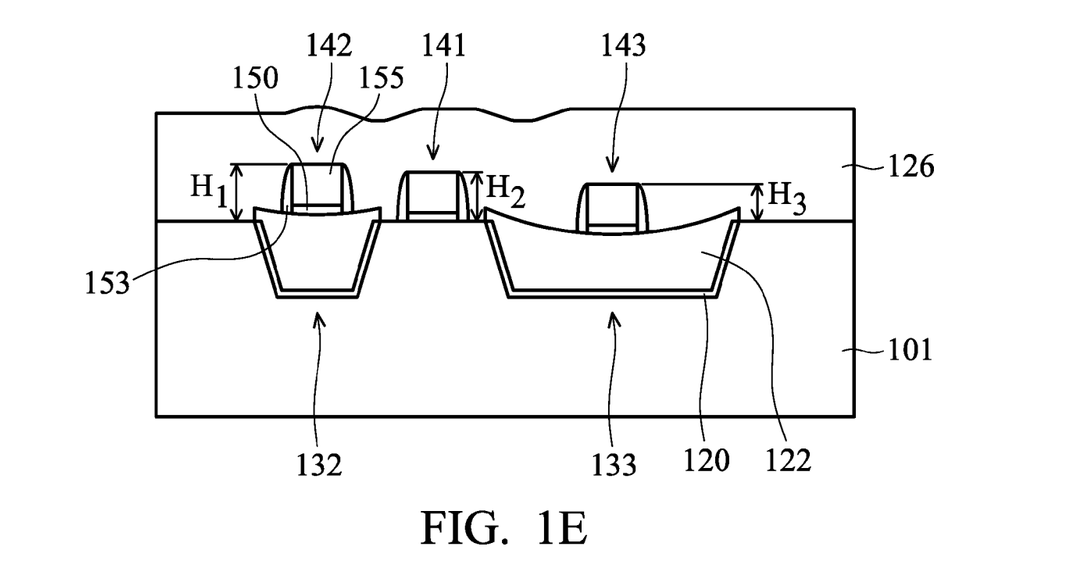
FIG. 1E shows different filler thicknesses in different trenches causing the replacement gate (RPG) structures formed to have different heights, in accordance with some embodiments.

In addition, the different filler thicknesses in different trenches on the substrate can cause the replacement gate (RPG) structures formed to have different heights, as shown in FIG. 1E in accordance with some embodiments. FIG. 1E shows 3 exemplary gate structures 141, 142, and 143 on substrate 101. Due to the non-planarity of the surfaces that these gates are disposed upon, the heights of gate structures 141 ($H_2$), 142 ($H_1$), and 143 ($H_3$) are not the same, as shown in FIG. 1E in accordance with some embodiments. In some embodiments, the gate structures include a gate dielectric layer 150, a dummy polysilicon layer 155, and nitride spacers 153. In some embodiments, other materials and/or layers are included in the gate structures. After the gate structures are formed, an etch stop layer (ESL) (not shown) and interlayer dielectric (ILD) 126 may be formed over the substrate 101, including over the at least one gate structures, by any suitable process. The ESL may include silicon nitride, silicon oxynitride, and/or other suitable materials. The ESL composition may be selected based upon etching selectivity to one or more additional features of the device region 100. In the present embodiment, the ESL is a contact etch stop layer (CESL). The ILD 126 may include silicon oxide or a low dielectric constant (low-k) material. In some embodiments, the ILD 126 includes a high-density plasma (HDP) oxide. In some alternative embodiments, the ILD may optionally include a spin-on-glass (SOG) or high aspect ration process (HARP) oxide.

Figure 1F:
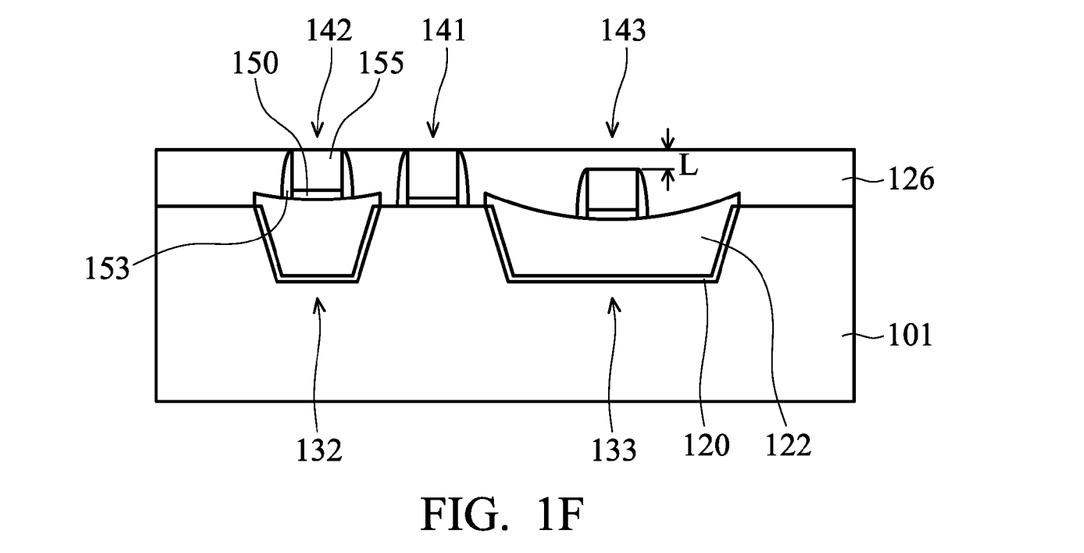
FIG. 1F shows an ILD layer being planarized by a CMP process until top portions some gate structures are exposed, in accordance with some embodiments.

The ILD 126 is planarized by a CMP process until a top portion of the at least one gate structures, such as gate structures 141, 142, or 143, overlying the semiconductor substrate 101 is exposed as illustrated in FIG. 1F, in accordance with some embodiments. The differing heights of the gate structures, such as structures 141, 142, and 143, could leave some ILD 126 over the dummy polysilicon layer. As shown in FIG. 1F, there is a thickness "L" of ILD 126 over gate structure 143. For RPG (replacement gate) process, the dummy polysilicon layer 155 needs to be etched away and be replaced with other material(s), such as a metal gate and/or a work functional layer. The remaining ILD 126 over structure 143 would prevent the dummy polysilicon 155 in structure 143 from being removed (such as by etching), which would impact device yield. The embodiment shown above in FIGS. 1A-1F illustrates issues caused by non-planarity and un-uniformity introduced by CMP.

Gas cluster ion beams (GCIBs) are cluster ion beams and can be used to remove (or etch) film from substrate surface. The gas clusters are nano-sized aggregates of materials that are gaseous under conditions of standard and elevated temperature and pressure. When a gaseous material is released into a vacuum chamber as a jet, the jet is inherently cooled as static enthalpy is exchanged for kinetic energy. The cooling results from expansion of the jet in the vacuum. A portion of the jet is rapidly cooled and condensed to form gas clusters. The gas clusters can be ionized by electron bombardment, which permits the gas clusters to be formed into directed beams of controllable energy. The ionized gas clusters can also be accelerated to attain a desired kinetic energy.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification, such as etching, but without the tendency to produce deeper sub-surface damage that is characteristic of some other ion beam processing. An example of a GCIB apparatus, which is hereby incorporated by reference, can be found in U.S. Patent Publication No. 2009/0087578, filed on Sep. 29, 2007, and titled "Method for Depositing Films Using Gas Cluster Ion Beam Processing."

Figure 2A:
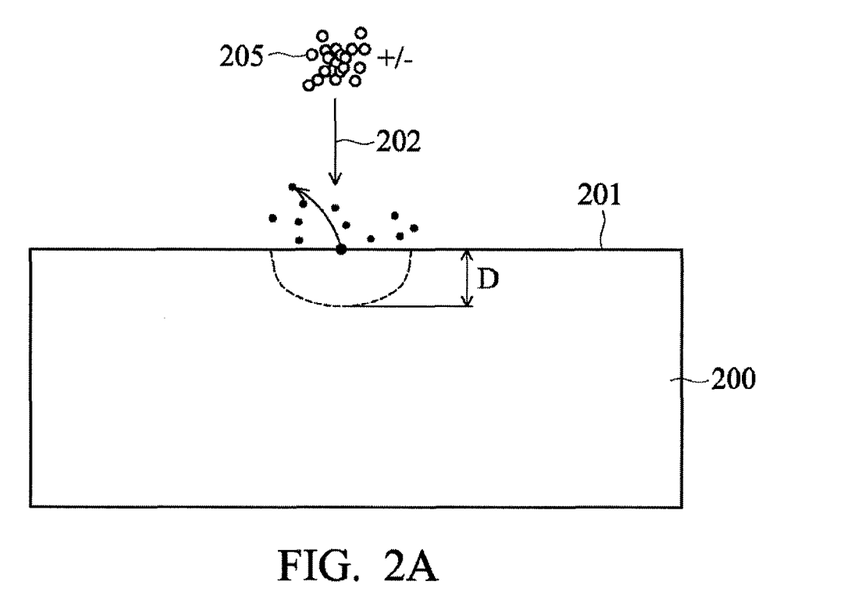
FIG. 2A shows a gas cluster hitting a substrate surface, in accordance with some embodiments.

Referring to FIG. 2A, a gas cluster 205 is formed by releasing a gaseous precursor(s), which would remove silicon dioxide into a vacuum chamber in accordance with some embodiments. In some embodiments, the gaseous precursor may includes an etching gas, such as $NF_3$ and $CF_4$ for removing dielectric films, such as oxide, nitride, or oxynitride, or silicon containing film, such as polysilicon. Other possible etching gaseous precursors may be or may include, but are not limited to, carbon and fluorine containing gas (such as $C_xF_y$ or $C_mH_nF_o$), halides (such as HBr), $SF_6$, $Cl_2$, or HF. The gaseous precursors may also include etching-assisting gas, such as $O_2$, $N_2$, or $NH_3$, in some embodiments. In addition, the gaseous precursors may include a carrier gas (or diluting gas, or inert gas), such as Ar or He, in some embodiments. The gaseous precursors may further include one or more dopant gases, such as $B_2H_6$, $PH_3$, $AsH_3$, or $GeH_4$. Other types of applicable gases may also be used as gaseous precursors for GCIB.

In some embodiments, the clusters can be ionized and filtered to travel in a direction 202 substantially perpendicular to the substrate surface 201. The ion clusters can also be accelerated by an electric field to attain a desired kinetic energy and would dissociate into gaseous species, such as molecules and charged molecules, when the ion clusters hit the substrate surface 201, as shown in FIG. 2A in accordance with some embodiments.

In some embodiments, the gas can be a mixture with two or more types of gases that do not react at room temperature or low temperature, such as from about 15° C. to about 200° C. In some embodiments, the gaseous precursor(s) contains $NF_3$ gas. When the ion clusters of the gas mixture hit the substrate surface, the kinetic energy of the ion clusters is converted into thermal energy, which results in very high local temperature (such as >400° C.), which enables the gas mixture to react to form the metal film with residual gas species that would leave the substrate surface.

The ion clusters can contain a few to several thousand molecules, in accordance with some embodiments. In some embodiments, the ion clusters have kinetic energy ranging form about 1 keV to several tens of keV, such as 90 keV. In some other embodiments, the ion clusters have kinetic energy ranging from about 20 keV to about 60 keV. Upon the ion clusters impacting the substrate surface 201 (at point A, for example), the kinetic energy is transformed into heat that creates localized high temperature, which helps to release (or drive) the un-reacted gaseous species along with reacted species from the substrate surface. The reacted species refer to the etch byproduct of etching gas precursors with surface film. The impact time is very short, such as a few pico seconds, in accordance with some embodiments. Due to the short impact time and the range of kinetic energy of the cluster ions, the depth "D" of surface layer of the substrate 200 affected is very shallow, such as between about 1 nm to about 50 nm. Although the instant local temperature (near impact point A) upon the impact occurs is very high, the temperature of the substrate (or entire substrate) can be kept unchanged because of the short impact time. In some embodiments, the local temperature at location A is between about 700° C. to about 1000° C.

Figure 2B:
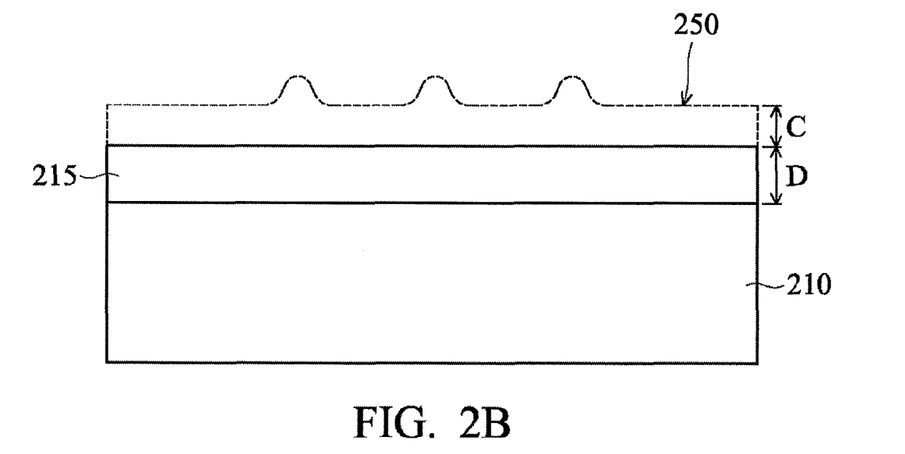
FIG. 2B shows a substrate with surface topography before and after a gas cluster ion beam (GCIB) etch to remove the surface topography, in accordance with some embodiments.

GCIB can be used to etch (or remove) materials and to planarize uneven surfaces. The surface layer after GCIB etching could become slightly different from the substrate body below. FIG. 2B shows that a substrate 210 with a film 215 with surface topography as indicated by curve 250, in accordance with some embodiments. The surface topography could be measured by a topography-measuring tool, such as an atomic force microscopy (AFM) or a profilometer, in accordance with some embodiments. In some embodiments, the film thickness of the surface film on the substrate is also measured. The measured topographical map, which could include thickness data, for the substrate is then fed to the GCIB tool to remove surface area with high topography, as shown in FIG. 2B, in accordance with some embodiments. In addition to remove surface topography, the GCIB can be used to remove additional film thickness "C" as shown in FIG. 2B to the target thickness "D" for film 215, in accordance with some embodiments. As mentioned above, GCIB can damage the top surface. However, the "damaged" surface layer is very shallow, such as between about 1 nm to about 50 nm thick. In some embodiments, the damaged surface layer can be removed by a short wet etch, such as a buffer oxide etch (BOE) to remove an oxide layer.

Table 1 shows uniformity data of an exemplary substrate after about 3,600 Å PSG (phosphorous-doped silicon glass) oxide is deposited, after GCIB etch is used to remove about 1,000 Å PSG and to reduce surface topography, and after a short BOE wet etch is performed following GCIB etch to remove a surface layer (possibly damaged).

| After Film Deposition | After GCIB Etch | After BOE Wet Etch |
|---|---|---|
| $3\sigma$ = 24.1 nm (6.8%) | $3\sigma$ = 4.5 nm (1.7%) | $3\sigma$ = 4.2 nm (1.8%) |

Table I shows a comparision of uniformity data of a substrate after various process operations.

The data in Table I show that after PSG deposition, the $3\sigma$ (3 sigma) thickness percentage is slightly high at about 6.8% (or +/−24.1 nm). The substrate film thickness uniformity data are taken by an optical metrology tool, such as SFX-100 made by KLA-Tencor of Milpitas, Calif. The substrate surface topography data, which also include information of thicknesses and corresponding coordinates, are then fed to a GCIB system, which uses the data to identify locations and how much film to remove. The data in Table I show that after the GCIB etch treatment, the thickness uniformity (3 sigma) is reduced to 1.7% (or +/−4.5 nm). As mentioned above, GCIB etch could leave a damaged surface layer, such as between about 1 nm to about 50 nm, damaged. The damaged layer can be removed by wet etch. The post-GBIC-etch substrate is wet etched by BOE for a short period and measured for its thickness uniformity. The data showed that the uniformity is about the same as the uniformity after GCIB etch, which demonstrates that GCIB etch does not damage the substrate surface non-uniformly. In some embodiments, the planarity requirement (3 sigma requirement) is less than about +/−50 Å. 3 sigma surface planarity of 4.5 nm (or +/−45 Å) would meet the requirement.

In addition to blank wafers, GCIB etch is performed on patterned substrates to demonstrate its applicability in improving planarity on patterned substrates. Table 2 shows film uniformity data of an exemplary patterned substrate deposited with an oxide film and is treated with a GCIB etch. The deposited film thickness is about 3,500 Å. About 2,500 Å of the deposited film is removed by CMP. GCIB etch removes about 500 Å of the post-CMP film.

| After Film Deposition | After GCIB Etch |
|---|---|
| $3\sigma = 17.1$ nm | $3\sigma = 4.2$ nm |

The data in Table II show that after PSG deposition, the $3\sigma$ (3 sigma) thickness range is slightly high at about 17.1 nm. A substrate surface topography is then taken. The substrate surface topography data (with thicknesses and coordinates) are then fed to a GCIB system, which removes the oxide film on the substrate. The post etching thickness 3 sigma variation is reduced to 4.2 nm, which shows that GCIB can be used on patterned substrate to improve uniformity. In some embodiments, the planarity requirement is less than about +/−50 Å. 3 sigma surface planarity of 4.2 nm (or +/−42 Å) would meet the requirement.

Figure 3A:
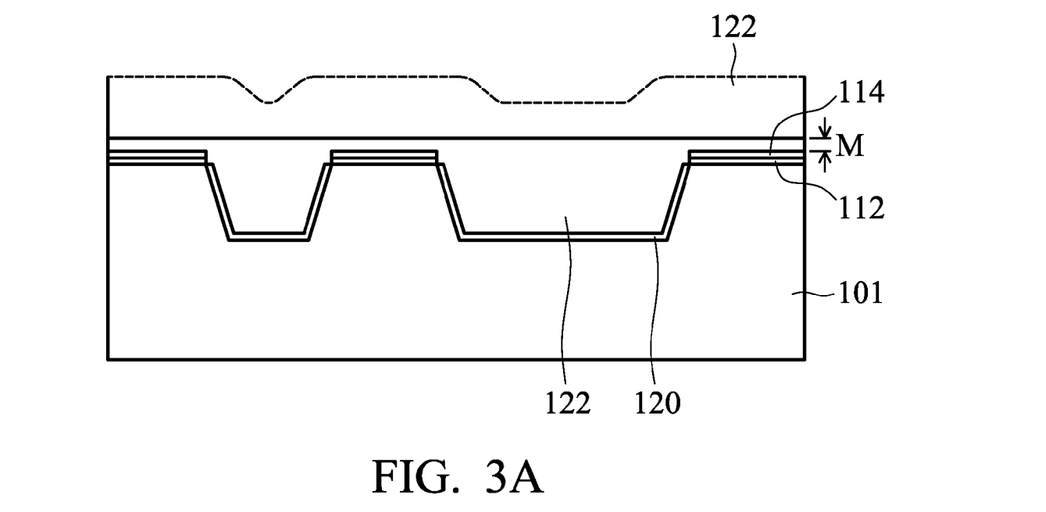
FIG. 3A shows a substrate with trenches before and after a filler layer is planarized by CMP, in accordance with some embodiments.

The experimental data shown and described above in Tables I and II illustrate that GCIB etch can be used to improve planarity on blank and patterned substrates. For the STI structures described above in FIG. 1A, the CMP process can proceed to polish a portion of the filler layer 122 and leave some filler layer 122 with a thickness "M" on the substrate, as shown in FIG. 3A in accordance with some embodiments. In some embodiments, the CMP process is stopped before the CMP touches the second dielectric layer 114. In some other embodiments, the CMP process is stopped when the CMP polishing pad starts to touch the second dielectric layer 114. After the CMP process is stopped, the substrate is measured for its topography and thickness. In some embodiments, only WIW uniformity data are collected. In some other embodiments, both the WIW and WID data are collected. The more the WIW and WID data are collected, the more uniform the substrate can be after planarization by GCIB etch. However, taking additional data will take extra time.

Figure 3B:
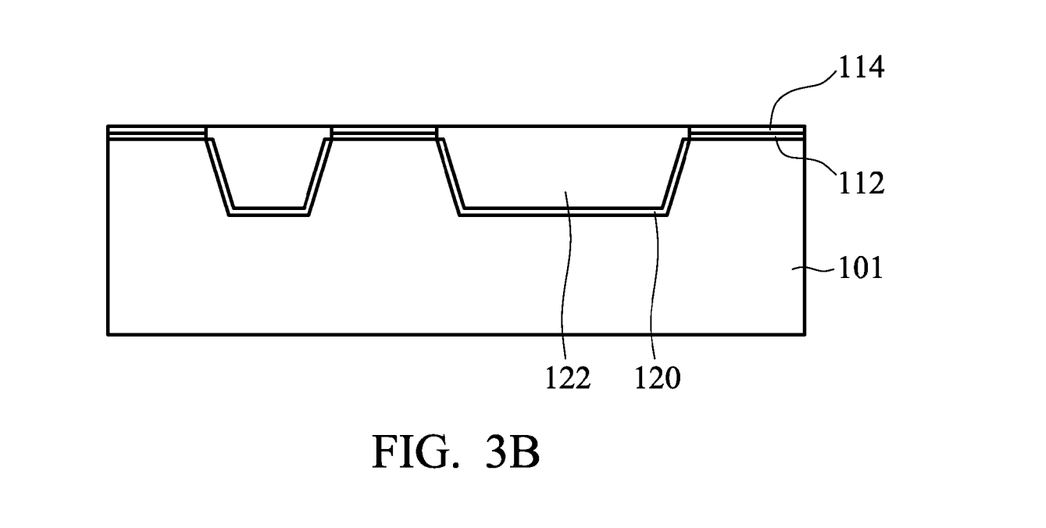
FIG. 3B the substrate of FIG. 3A after GCIB etch, in accordance with some embodiments.

FIG. 3B shows substrate 101* after GCIB etch, in accordance with some embodiments. FIG. 3B shows that due to the precision etching by GCIB etch with the help of the topography and thickness map(s) (or data), the filler layer 122 can be planarized with much better uniformity, without dishing, and without over or under polishing. The initial removal of oxide by CMP can increase the throughput time, since CMP process has good throughput. The final removal of remaining oxide by CMP can greatly improve Both WIW and WID thickness uniformities.

In addition to improve planarity, GCIB etch can also enable more precise pinpoint of etch (or polishing) endpoint. As mentioned above, the non-uniformity of CMP can lead to dishing, over-polishing, and/or under-polishing. With the aide of thickness measurement data (or map), GCIB etch can be adjusted to remove film thickness locally to the amount desired to achieve the planarity needed to meet specification. In some embodiments, multiple thickness and/or topography measurements can be taken between multiple GCIB etches to achieve the final and desired film removal. With the aide of multiple thickness and/or topography measurements accompanying GCIB etch, better planarity across the substrate and within die can be achieved. In some embodiments, 3 sigma thickness variation of less than 25 Å can be achieve. However, multiple measurements and multiple GCIB etches would slow down the manufacturing process and increase production cost.

Figure 3C:
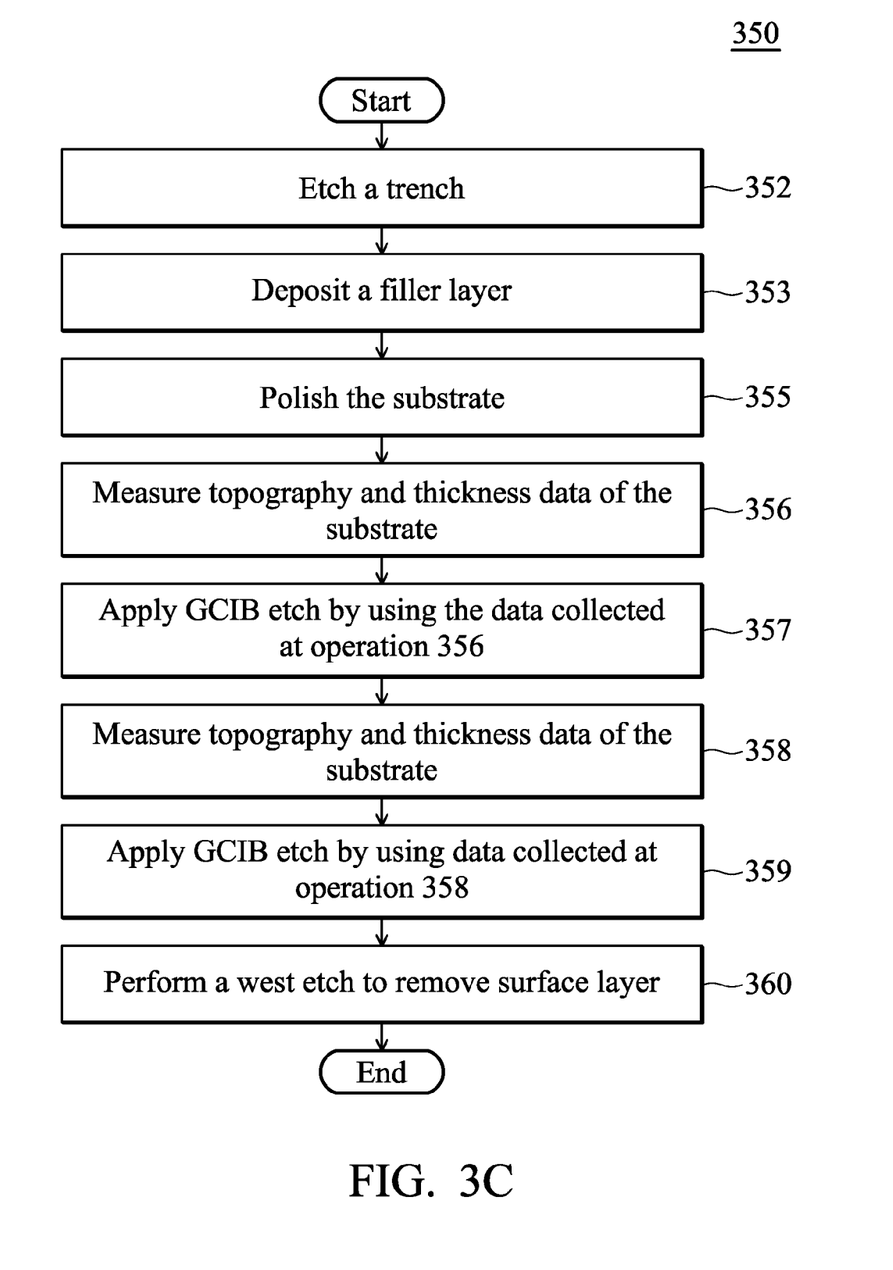
FIG. 3C shows a process flow of forming STI structures on a substrate, in accordance with some embodiments.

FIG. 3C shows a process flow 350 of forming STI structures on a substrate, in accordance with some embodiments. At operation 351, a trench is formed by etching a substrate with a hardmask layer. As mentioned above, the substrate can have one or more dielectric layers that are patterned to be used as a hard mask(s) for trench etching. After the trench is etched, a filler layer is deposited at operation 353, in accordance with some embodiments. At described above for FIG. 1A, the filler layer is made of a dielectric material. In some embodiments, a liner layer is deposited to line the walls of the trench before the filler layer is deposited.

Afterwards, a CMP process is applied on the substrate to remove a portion of the filler layer and to globally planarize the substrate at operation 355. In some embodiments, the CMP process is stopped before the hardmask layer. In some other embodiments, the CMP process is stopped when CMP starts to touch the hardmask layer. In at least one embodiment, the hardmask layer is also used as a CMP stop layer. Afterwards, at operation 356 surface topography and film thickness of the substrate are measured. The measurements are taken across the substrate. In some embodiments, WID data are also taken (in addition to WIW data). The data are taken with their coordinates. After the data are collected, the data are fed to a GCIB etch tool. At operation 357, a GCIB etch is applied on the substrate to remove the filler layer above the trench(es) to achieve planarity by using the data collected at operation 356, which enables the GCIB etch tool to determine how much to remove at different locations on the substrate.

In some embodiments, an optional operation 358 of measuring the topography and thickness of the filler layer on the substrate is performed again after GCIB etch at operation 357. The operation 358 is used to check if the planarity of the substrate meets the target and to also check if there is filler layer left outside the trench to be removed. If planarity is not satisfactory and/or there is still filler layer outside the trench, an optional operation 359 is performed to remove excess filler layer on the substrate and to achieve the targeted planarity. Operations 358 and 359 can be repeated a number of times until the desired result is achieved. After the GCIB etch is completed, a wet etch is performed at operation 360 to remove the damaged layer on the substrate surface, in accordance with some embodiments. Since the damaged layer is very shallow, the wet etch is very short. In some embodiments, the wet etch is performed for a duration from about 5 seconds to about 5 minutes. In some embodiments, operation 360 is not performed.

Figure 4A:
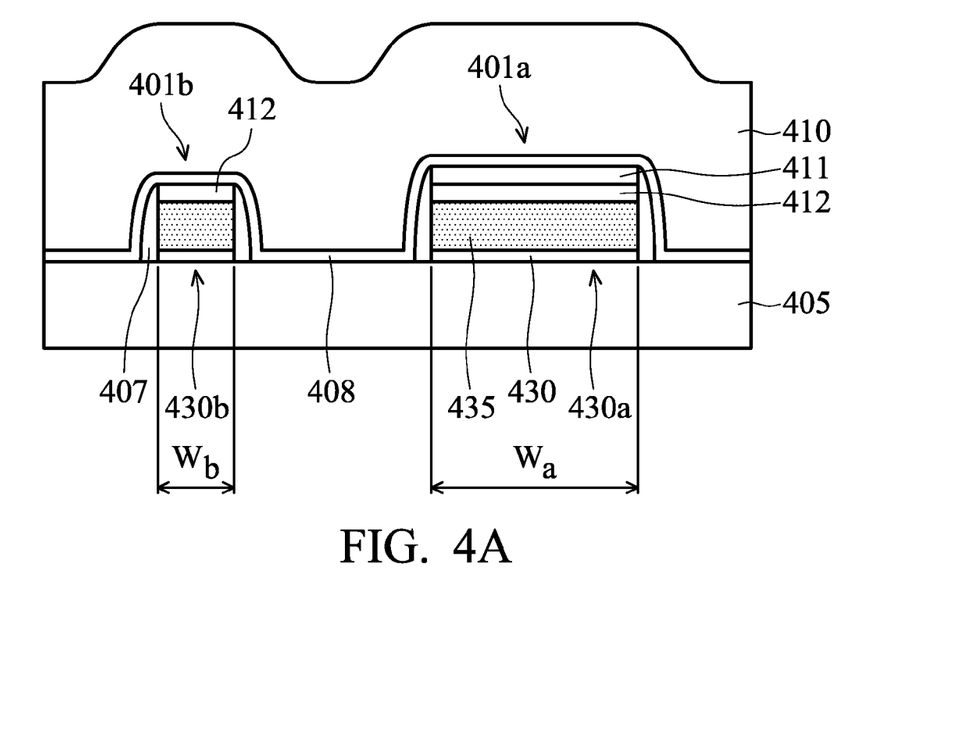
FIG. 4A shows a cross-sectional view of a device area with two gate structures, in accordance with some embodiments.

Using GCIB etch to improve planarity and/or perform final film removal as presented above does not only apply to STI filler layer removal. The mechanism may also apply to other types of planarization schemes to achieve planarity and film removal. FIG. 4A shows a cross-sectional view of a device area 400 with two gate structures 401a, 401b, in accordance with some embodiments. The device area 400 is built on a substrate 405. The gate structures 401a, 401b have two gate stacks 403a, 403b respectively. In some embodiments, gate stacks 403a, 403b each has multiple layers in the stacks. For example, the gate stacks 403a, 403b may include a gate dielectric layer 430, which can be a silicon oxide layer, an oxy-nitride composite layer, a high-dielectric constant (high-K) dielectric layer, or an high-K dielectric layer over an oxide layer. The gate stacks 403a, 403b may also include a dummy gate layer 435, which is made of a conductive material, such as polysilicon. The gate stack 403a, 403b may also include other layers, such as a barrier layer and/or a workfunction layer for replacement gates (not shown).

The gate stacks 403a and 403b are patterned with a dual-layer hardmasks, which includes a first hardmask layer 411 over a second hardmask layer 412 in accordance with some embodiments. Both hardmask layers are made of dielectric materials. In some embodiments, hardmask layer 411 is made of an oxide and hardmask layer 412 is made of a nitride or oxynitride. Layer 411 and layer 412 may be formed by a deposition process, such as chemical vapor deposition (CVD), including plasma-enhanced CVD (PECVD), thermal CVD, high-density-plasma CVD (HDPCVD), etc., a spin-on process, or a high aspect ration process (HARP) oxide. Other applicable processes may also be used. Since the gate width (or length) of gate stack 403a "Wa" is significantly wider than that of gate stack 403b "Wb", the first mask layer 411 can be removed during patterning of gate stacks 413a, 413b for gate stack 403b, in accordance with some embodiments. This is the result of un-developed photoresist over gate structure 403a protecting the hardmask layer 411.

The gate stacks 403a, 403b are surrounded by spacers 407, which are made of dielectric material(s). Other layers could exist between the gate stacks 403a, 403b and the spacers 407. In some embodiments, the gate stacks 403a, 403b are covered by a etch stop layer (ESL) 408, which extends to the substrate surface that are not covered by the gate stacks 403a, 403b. On top of the ESL 408, there is an interlayer dielectric (ILD) 410, which can be deposited by any suitable process. The ESL may include silicon nitride, silicon oxynitride, and/or other suitable materials. The ESL composition may be selected based upon etching selectivity to one or more additional features of the device region 400. In the present embodiment, the ESL is a contact etch stop layer (CESL). The ILD 410 may include silicon oxide or a low k material. In some embodiments, the ILD 410 includes a high-density plasma (HDP) oxide. In some alternative embodiments, the ILD may optionally include a spin-on-glass (SOG) or high aspect ration process (HARP) oxide.

In some embodiments, the ILD 410 is planarized by one or more CMP processes until the dummy gate layer 435 is exposed. As described above, due to the larger gate width (or length) "Wa" of gate structure 401a than "Wb" of gate structure 401b, the hardmask layer 411 remains on gate stack 403a, but not on gate stack 403b. In addition, the CMP process could polish the ILD 410 over the narrower structure 403b at a greater rate than the wider gate stack 403a. As a result, the dielectric layers over dummy gate layer 435 of narrower gate structure 403b could be completely removed before the dielectric layers over gate structure 403a. It's challenging to use CMP to remove film(s) on a substrate surface with varying widths (or sizes of structures) and with different material layers.

Figure 4B:
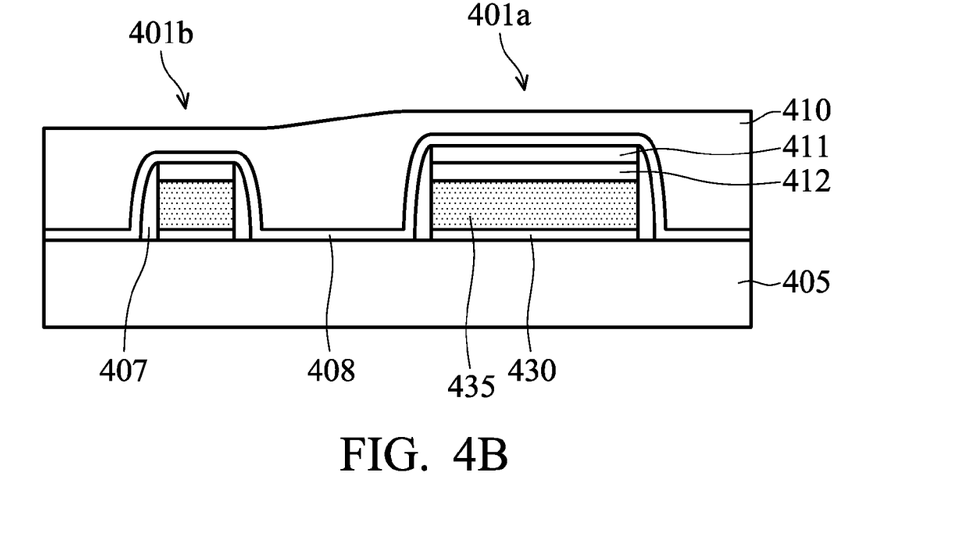
FIG. 4B shows the substrate of FIG. 4A after a CMP process, in accordance with some embodiments.

To achieve removal of various dielectric layers above the dummy gate layers 435 for gate structures with varying widths and lengths, a portion of ILD 410 is removed as shown in FIG. 4B in accordance with some embodiments. The CMP process removes large-size surface topography and improves the planarity. However, the CMP process leaves behind some WIW and WID non-uniformity. FIG. 4B shows that the remaining layer 410 is thinner on gate structure 401b than the wider gate structure 401a. This is due to CMP removing films at a faster rate near narrower and isolated structures. In some embodiments, a thin layer of ILD 410 remains on the gate structures 401a and 401b. In some other embodiments, CMP stops when the ILD 410 is completely removed and hardmask layer 412 is exposed on some part of the substrate.

Afterwards, the surface topography and thickness of the substrate is measured. One or more GCIB etches can then be used to remove the dielectric films, such as ILD 410, hardmask layer 411 and hardmask layer 412, on structures, such as gate structure 403a and 403b. In some embodiments, one GCIB etch is performed. The single GCIB etch is used to remove different types of dielectric layers over the dummy gate layer 435. The gaseous precursors used for GCIB of dielectric film may be a gas mixture including some or all of the following gases: $C_xH_yF_z$, $NF_3$, HBr, $SF_6$, $Cl_2$, $O_2$, $N_2$, $NH_3$, or an inert gas (such as Ar or He). In some other embodiments, more than one GCIB etches are performed. Different source gases and/or different processing conditions are used to remove different types of dielectric films. As described above, the topographical and thickness measurement taken after GCIB etch can be performed more than once to ensure achieving targeted planarity and complete removal of dielectric layers above the dummy gate layer 435.

Figure 4C:
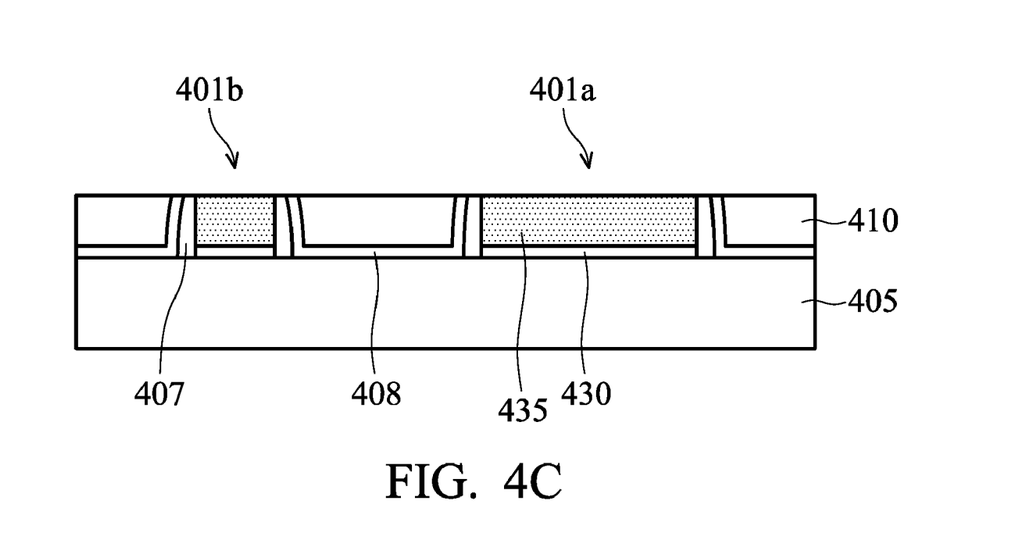
FIG. 4C shows the substrate of FIG. 4B after a GCIB etch, in accordance with some embodiments.

FIG. 4C shows a cross-sectional diagram of structures in FIGS. 4A and 4B after GCIB etch(es), in accordance with some embodiments. As mentioned above, multiple topography and thickness measurements and GCIB etches can be conducted to complete the planarization process. A wet etch may also be used at the end to remove a damaged surface layer. GCIB etch with the help of topographical and thickness data allows differential etching across the substrate to achieve targeted planarity without jeopardizing the integrity of the gate structures. The process mechanisms of using the combination of CMP, surface topography measurement and GCIB etch to improve surface planarity not only can be used for RPG processes, the mechanisms may also apply to gate first processes (non-dummy gate processes). Gate first processes may also benefit from the improved planarity to enable patterning of fine features after the planarization process.

Figure 5A:
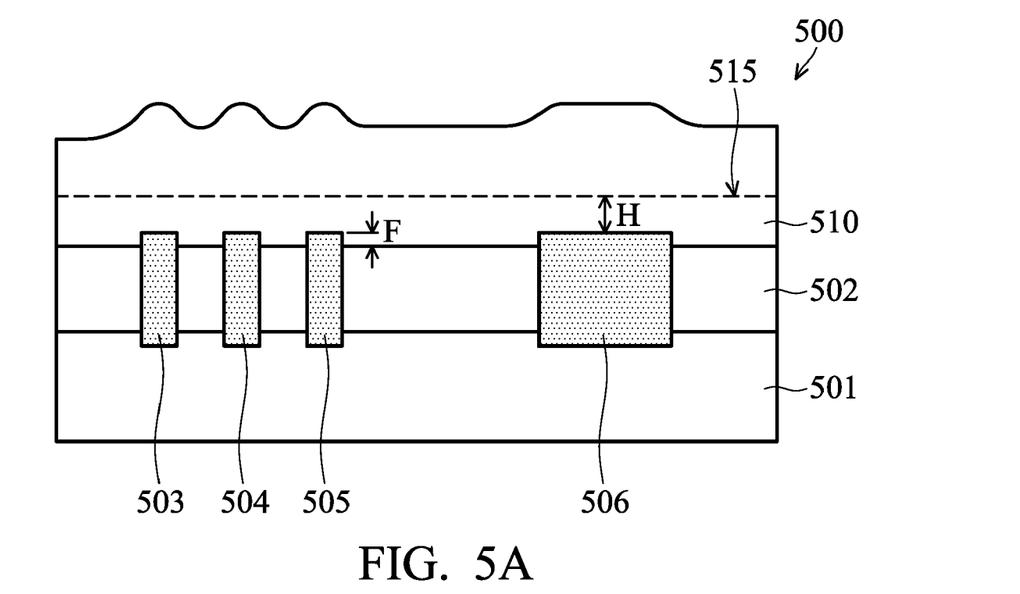
FIG. 5A shows a device region on a substrate, in accordance with some embodiments.

Another example of applying the planarization mechanisms described is the planarization of a polysilicon layer over diffusion areas of FIN (silicon fin) structures of silicon fin field-effect transistor (FINFET) technology. FIG. 5A shows a device region 500 on a substrate 501, in accordance with some embodiments. Device region 500 has an oxide layer 502 and has a number of silicon fin structures 503, 504, and 505. In some embodiments, the oxide layer 502 is used to fill shallow trenches of shallow trench isolation (STI) structures. Device region 500 also has a large silicon structure 506. A polysilicon layer 510 is deposited over the oxide layer 502 and silicon structures 503, 504, 505, and 506. The silicon structures (fin structures) 503, 504, 505, and 506 have a fin height "F". To form the FINFET structures, the polysilicon layer 510 needs to be planarized to leave a thickness "H" (see curve 515), which is the polysilicon gate height, over the silicon structures 503, 504, 505, and 506, as shown in FIG. 5A. Due to no CMP polish stopping layer, it is difficult to polish the polysilicon layer 510 to meet the planarity requirement. In some embodiments, the planarity requirement is less than about +/−50 Å.

Figure 5B:
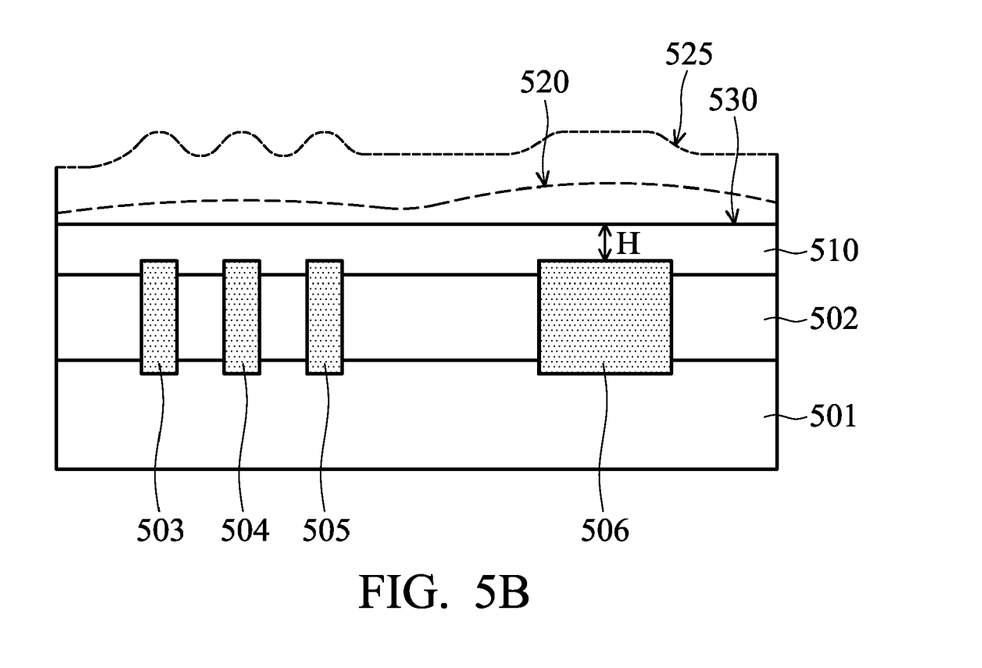
FIG. 5B shows a device region on a substrate after CMP and GCIB etch processes, in accordance with some embodiments.

To achieve the required planarity, CMP process can be used to remove and planarize the polysilicon layer 510 before the polysilicon layer 510 reaches the final thickness (thickness "H" above fin structures). Curve 525 of FIG. 5B shows the original polysilicon profile. Curve 520 of FIG. 5B shows the post CMP substrate surface, in accordance with some embodiments. Afterwards, the substrate is measured for its topography and polysilicon thickness across the wafer and/or across dies on the substrates. The topography and thickness data are used to enable GCIB etch to planarize the substrate to the final thickness (curve 530) and to meet the required planarity. As mentioned above, multiple topography and thickness measurements and GCIB etches can be conducted to complete the planarization process. A wet etch may also be used at the end to remove a damaged surface layer. GCIB etch with the help of topographical and thickness data allows differential etching across the substrate to achieve targeted planarity.

The embodiments of mechanisms described enables improved planarity of substrates, which is crucial for patterning and device yield improvement. CMP is used to remove film to planarize the substrate before the final thickness is reached or before all removal film is polished. The substrate is then measured for its topography and film thickness. The topography and thickness data are used by the GCIB etch tool to determine how much film to remove on a particular location. GCIB etch enables removal of final layer to meet the requirements of substrate uniformity and thickness target. The mechanisms enable improved planarity to meet the requirement of advanced processing technologies.

In one embodiment, a method of planarizing a substrate is provided. The method includes depositing a first layer on a substrate with device features on a surface of the substrate. Topography of the device features causes the first layer deposited on the substrate to have a first surface topography. The method also includes removing a portion of the first layer from the substrate by using a chemical-mechanical polishing (CMP) process to reduce the first surface topography. The method further includes collecting data of a second surface topography of the substrate after the portion of the first layer is removed from the substrate by the CMP process. In addition, the method includes performing a gas cluster ion beam (GCIB) etch on the remaining portion of the first layer over the device features by using the collected data of the second surface topography of the substrate to determine amount of the first layer to etch at different locations. The GCIB etch reduces the second surface topography and improves planarity of the substrate.

In another embodiment, a method of planarizing a substrate is provided. The method includes depositing a first layer on a substrate with gate structures on a surface of the substrate, and depositing a second dielectric layer on the substrate following the deposition of the first dielectric layer. Topography of the device features causes the first dielectric and second dielectric layer deposited on the substrate to result in a first surface topography. The method further includes removing a portion of the second dielectric layer from the substrate by using a chemical-mechanical polishing (CMP) process to reduce the first surface topography. In addition, the method includes collecting data of a second surface topography of the substrate after the portion of the second dielectric layer is removed from the substrate by the CMP process. Additionally, the method includes performing at least a gas cluster ion beam (GCIB) etch on the remaining portion of the second dielectric layer and the first dielectric layer over the device features by using the collected data of the second surface topography of the substrate to determine amount of the second dielectric layer and the first dielectric layer at different locations to etch. The at least one GCIB etch reduces the second surface topography and improves planarity of the substrate.

Various modifications, changes, and variations apparent to those of skill in the art may be made in the arrangement, operation, and details of the methods and systems disclosed. Although the foregoing embodiments has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of planarizing a substrate, comprising:
depositing a first layer on a substrate with device features on a surface of the substrate, wherein topography of the device features causes the first layer deposited on the substrate to have a first surface topography;
removing a portion of the first layer from the substrate by using a chemical-mechanical polishing (CMP) process to reduce the first surface topography;
collecting data of a second surface topography of the substrate after the portion of the first layer is removed from the substrate by the CMP process; and
performing a gas cluster ion beam (GCIB) etch on a remaining portion of the first layer over the device features by using the collected data of the second surface topography of the substrate to determine amount of the first layer to etch at different locations, whereby the GCIB etch reduces the second surface topography and improves planarity of the substrate.

2. The method of claim 1, wherein the device features are trench structures, and wherein the trench structures are separated from one another, and wherein the first layer deposited on trench structures is used to fill the trench structures.

3. The method of claim 2, wherein the first layer is made of a material selected from a group consisting of oxide, nitride, or oxynitride.

4. The method of claim 1, wherein the second topography data are collected by an atomic force microscopy (AFM), a profilometer, or an optical thickness metrology tool.

5. The method of claim 1, wherein the collecting data comprises collecting data both within wafer and within die data.

6. The method of claim 1, wherein a process gas of the GCIB etch is selected from a group consisting of $SiH_4$, $NH_3$, $N_2$, Ar, He, $O_2$, $NF_3$, $CF_4$, $B_2H_6$, $PH_3$, $AsH_3$, $GeH_4$, $CH_4$, $C_xH_yF_z$, HBr, $SF_6$, $Cl_2$, or a combination thereof.

7. The method of claim 1, further comprising:
performing a wet etch on the substrate after the GCIB etch is performed to removed a surface layer damaged by GCIB etch.

8. The method of claim 7, wherein the surface layer damaged by the GCIB etch is between about 1 nm to about 50 nm.

9. The method of claim 1, wherein the 3 sigma of surface planarity of the substrate is less than about 50 Å.

10. The method of claim 1, wherein the device features are gate structures, and wherein the gate structures are separated from one another, and wherein the first layer deposited on trench structures is used to gapfill spaces between the gate structures.

11. The method of claim 10, wherein first layer is a dielectric film.

12. The method of claim 10, wherein a second layer is deposited between the gate structures and the first layer, and wherein both the first and the second layers are dielectric films.

13. The method of claim 1, wherein the device features are fins of fin field-effect transistors (FINFET), and wherein the fins are separated from one another, and wherein the first layer deposited on the fins is a polysilicon film.

14. The method of claim 1, wherein layer thickness with corresponding coordinates data are also collected with the data of the second surface topography of the substrate are collected.

15. The method of claim 1, wherein the CMP process is stopped before one of the device features is touched by CMP process pad.

16. The method of claim 1, wherein the CMP process is stopped when CMP process pad comes in contact with at least one of the device features.

17. A method of planarizing a substrate, comprising:
depositing a first layer on a substrate with gate structures on a surface of the substrate;
depositing a second dielectric layer on the substrate following the deposition of the first dielectric layer, wherein topography of the device features causes the first dielectric and second dielectric layer deposited on the substrate to result in a first surface topography;
removing a portion of the second dielectric layer from the substrate by using a chemical-mechanical polishing (CMP) process to reduce the first surface topography;
collecting data of a second surface topography of the substrate after the portion of the second dielectric layer is removed from the substrate by the CMP process; and
performing at least a gas cluster ion beam (GCIB) etch on a remaining portion of the second dielectric layer and the first dielectric layer over the device features by using the collected data of the second surface topography of the substrate to determine amount of the second dielectric layer and the first dielectric layer at different locations to etch, whereby the at least one GCIB etch reduces the second surface topography and improves planarity of the substrate.

18. The method of claim 17, wherein the 3 sigma of surface planarity of the substrate is less than about 50 Å.

19. The method of claim 17, wherein one GCIB etch is used to remove both the second dielectric layer and the first dielectric layer.

20. The method of claim 17, wherein a gas precursor for the GCIB etch includes $NF_3$.

* * * * *